(12) United States Patent
Qiao et al.

(10) Patent No.: US 10,591,519 B2
(45) Date of Patent: Mar. 17, 2020

(54) DETECTING FAULTS IN WIND TURBINES

(71) Applicant: NUtech Ventures, Lincoln, NE (US)

(72) Inventors: Wei Qiao, Lincoln, NE (US); Xiang Gong, Lincoln, NE (US)

(73) Assignee: NUtech Ventures, Lincoln, NE (US)

( * ) Notice: Subject to any disclaimer, the term of this patent is extended or adjusted under 35 U.S.C. 154(b) by 1958 days.

(21) Appl. No.: 13/904,469

(22) Filed: May 29, 2013

(65) Prior Publication Data

US 2013/0325373 A1 Dec. 5, 2013

Related U.S. Application Data

(60) Provisional application No. 61/652,396, filed on May 29, 2012.

(51) Int. Cl.
| | |
|---|---|
| *G01R 19/25* | (2006.01) |
| *G01R 31/34* | (2020.01) |
| *F03D 7/02* | (2006.01) |
| *F03D 17/00* | (2016.01) |

(52) U.S. Cl.
CPC ....... *G01R 19/2509* (2013.01); *F03D 7/0296* (2013.01); *F03D 17/00* (2016.05); *G01R 31/343* (2013.01); *F05B 2270/334* (2013.01); *Y02E 10/723* (2013.01)

(58) Field of Classification Search
CPC ... G01R 19/2509; G01R 31/343; F03D 17/00; F03D 7/0296; Y02E 10/722; Y02E 10/723; F05B 2270/334
USPC .......................................................... 702/58
See application file for complete search history.

(56) References Cited

U.S. PATENT DOCUMENTS

| | | | | |
|---|---|---|---|---|
| 5,483,153 | A | * | 1/1996 | Leeb ...................... G01R 19/25 324/102 |
| 7,040,859 | B2 | | 5/2006 | Kane |
| 7,268,443 | B2 | | 9/2007 | Kikuchi et al. |
| 7,888,810 | B2 | | 2/2011 | Moretto |
| 7,952,216 | B2 | | 5/2011 | Kikuchi et al. |
| 8,067,845 | B2 | | 11/2011 | Thulke et al. |
| 10,359,473 | B2 | | 7/2019 | Qiao et al. |

(Continued)

OTHER PUBLICATIONS

Gong and Qiao, "Imbalance fault detection of direct-drive wind turbines using generator current signals," *IEEE Transactions on Energy Conversions*, Jun. 2012, 27(2):468-476.

(Continued)

*Primary Examiner* — Yoshihisa Ishizuka
(74) *Attorney, Agent, or Firm* — Fish & Richardson P.C.

(57) ABSTRACT

A wind turbine generator fault detection method is described. The method includes acquiring current data from a wind turbine generator during operation, determining frequency demodulated signals and amplitude demodulated signals by frequency demodulating and amplitude demodulating the current data, resampling the frequency and amplitude demodulated signals corresponding to the current data, monitoring a frequency spectra of the resampled frequency and amplitude demodulated signals corresponding to the current data to identify one or more excitations in the frequency spectra. In response to identifying one or more excitations in the frequency spectra at one or more of the variable fault characteristic frequencies, the method includes generating and transmitting an alert that indicates that a wind turbine generator fault is detected.

23 Claims, 5 Drawing Sheets

(56) References Cited

U.S. PATENT DOCUMENTS

| | | | |
|---|---|---|---|
| 2006/0066111 A1* | 3/2006 | Suryanarayanan | F03D 7/0272 290/44 |
| 2007/0265843 A1* | 11/2007 | Hetherington | G10L 21/0208 704/228 |
| 2008/0007247 A1 | 1/2008 | Gervais | |
| 2011/0098968 A1* | 4/2011 | Srinivasa | G01H 1/003 702/145 |
| 2011/0125419 A1* | 5/2011 | Bechhoefer | F03D 7/047 702/34 |
| 2012/0019723 A1 | 1/2012 | McGrath | |
| 2012/0299305 A1* | 11/2012 | Brogan | H02J 3/386 290/55 |
| 2013/0049733 A1 | 2/2013 | Neti | |
| 2013/0096848 A1 | 4/2013 | Hatch | |
| 2014/0003939 A1 | 1/2014 | Adams | |
| 2014/0152331 A1 | 6/2014 | Wagoner | |

OTHER PUBLICATIONS

Akin et al., "Low order PWM inverter harmonics contributions to the inverter-fed induction machine fault diagnosis," IEEE Trans. Ind. Electron., 2008, vol. 55, No. 2, pp. 610-619.

Amirat et al., "Condition monitoring of wind turbines based on amplitude demodulation," in Proc. IEEE Energy Convers. Congr. Expo., 2010, pp. 2417-2421.

Blödt et al., "Models for bearing damage detection in induction motors using stator current monitoring," IEEE Trans. Ind. Electron., 2008, vol. 55, No. 4, pp. 1813-1822.

Chapman, "Electric Machinery Fundamentals," 5th ed., New York: McGraw-Hill, Feb. 2011, 47-48.

Choqueuse et al., "Diagnosis of three-phase electrical machines using multidimensional demodulation techniques," IEEE Trans. Ind. Electron, 2012, vol. 59, No. 3, pp. 2014-2023.

Couch, "Digital & Analog Communication Systems," 7th ed. London: Prentice Hall, Jul. 2006, 282-290.

Djurovic et al., "Condition monitoring of wind turbine induction generators with rotor electrical asymmetry," IET Renewable Power Generation, 2012, vol. 6, No. 4, pp. 207-216.

Ebrahimi et al., "Advanced eccentricity fault recognition in permanent magnet synchronous motors using stator current signature analysis," IEEE Trans. Ind. Electron., 2014, vol. 61, No. 4, pp. 2041-2052.

Ebrahimi et al., "Static, dynamic and mixed eccentricity fault diagnosis in permanent magnet synchronous motors," IEEE Trans. Ind. Electron., 2009, vol. 56, No. 11, pp. 4727-4739.

Fadaeinedjad et al., "The impact of tower shadow, yaw error, and wind shears on power quality in a wind diesel system," IEEE Trans. Energy Convers., 2009, vol. 24, No. 1, pp. 102-111.

Feldman, "Hilbert Transform Application in Mechanical Vibration," 1st ed., New York: Wiley, Apr. 2011, pp. 14-20.

Freire et al., "Open-circuit fault diagnosis in PMSG drives for wind turbine applications," IEEE Trans. Ind. Electron., 2013, vol. 60, No. 9, pp. 3957-3967.

Garcia-Perez et al., "The application of high-resolution spectral analysis for identifying multiple combined faults in induction motors," IEEE Trans. Ind. Electron., vol. 58, No. 5, pp. 2002-2010, May 2011.

Gong et al., "Bearing fault detection for direct-drive wind turbines via stator current spectrum analysis," in Proc. Energy Conversion Congress and Exposition, 2011, pp. 313-318.

Gong et al., "Bearing fault diagnosis for direct-drive wind turbines via current-demodulated signals," IEEE Trans. Ind. Electron., 2013, vol. 60, No. 8, pp. 3419-3428.

Gong et al., "Current-based eccentricity detection for direct-drive wind turbines via synchronous sampling," in Proc. Energy Conversion Congress and Exposition, 2013, pp. 2972-2976.

Gong et al., "Current-based mechanical fault detection for direct-drive wind turbines via synchronous sampling and impulse detection," IEEE Trans. Industrial Electronics, in press. (Available online in IEEE Explore).

Gong et al., "Current-based online bearing fault diagnosis for direct-drive wind turbines via spectrum analysis and impulse detection," in Proc. IEEE Symposium on Power Electronics and Machines in Wind Applications, Jul. 2012, pp. 1-6.

Gong, "Online nonintrusive condition monitoring and fault detection for wind turbines," Ph.D. Dissertation, University of Nebraska—Lincoln, Aug. 2012.

Gustafsson, "Determining the initial states in forward backward filtering," IEEE Trans. Signal Processing, 1996, vol. 44, No. 4, pp. 988-992.

Hameed et al., "Condition monitoring and fault detection of wind turbines and related algorithms: A review," Renewable and Sustainable Energy Reviews, 2009, vol. 13, No. 1, pp. 1-39.

Hong et al., "Detection of airgap eccentricity for permanent magnet synchronous motors based on the d-axis inductance," IEEE Trans. Power Electron., 2012, vol. 27, No. 5, pp. 2605-2612.

Immovilli et al., "Currents and vibrations in asynchronous motor with externally induced vibration," in Proc. IEEE International Symposium on Diagnostics for Electric Machines, Power Electronics & Drives, 2011, pp. 580-584.

Immovilli et al., "Detection of generalized-roughness bearing fault by spectral-kurtosis energy of vibration or current signals," IEEE Trans. Ind. Electron., 2009, vol. 56, No. 11, pp. 4710-4717.

Immovilli et al., "Diagnosis of bearing faults in induction machines by vibration or current signals: A critical comparison," IEEE Trans. Ind. Appl., 2010, vol. 46, No. 4, pp. 1350-1359.

Kar et al., "Monitoring gear vibrations through motor current signature analysis and wavelet transform," Mechanical Systems and Signal Processing, 2006, vol. 20, No. 1, pp. 158-187.

Kia et al., "A modeling approach for gearbox monitoring using stator current signature in induction machines," in Proc. IEEE Industry Applications Society Annual Meeting, Oct. 2008, pp. 1-6.

Kia et al., "Analytical and experimental study of gearbox mechanical effect on the induction machine stator current signature," IEEE Trans. Industry Applications, 2009, vol. 45, No. 4, pp. 1405-1415.

Kia et al., "Gearbox monitoring using induction machine stator current analysis," in Proc. IEEE International Symposium on Diagnostics for Electric Machines, Power Electronics and Drives, 2007, pp. 149-154.

Link, et al., "Gearbox reliability collaborative project report: findings from phase 1 and phase 2 testing," National Renewable Energy Laboratory, Golden, CO, Tech. Rep. NREL/TP-5000-51885, Jun. 2011.

Lu et al., "A review of recent advances in wind turbine condition monitoring and fault diagnosis," in Proc. IEEE Symposium on Power Electronics and Machines in Wind Applications, 2009, pp. 1-7.

Luo et al., "Synthesized synchronous sampling technique for differential bearing damage detection," Journal of Engineering for Gas Turbines and Power, 2010, vol. 132, No. 7.

Musial et al., "Large-scale offshore wind power in the United States: Assessment of opportunities and barriers," Technical Report, National Renewable Energy Laboratory, Sep. 2010, [Online].

Oppenheim et al., "Discrete-Time Signal Processing," 3rd ed. Prentice Hall, 2009, 714-722, 775-789.

Pitas et al., "Nonlinear Digital Filters: Principles and Applications", Kluwer Academic Publishers, 1990, 63-65.

Rajagopalan et al., "Dynamic eccentricity and demagnetized rotor magnet detection in trapezoidal flux (brushless DC) motors operating under different load conditions," IEEE Trans. Power Electron., 2007, vol. 22, No. 5, pp. 2061-2069.

Ribrant et al., "Survey of failures in wind power systems with focus on Swedish wind power plants during 1997-2005," IEEE Trans. Energy Conversion, 2007, vol. 22, No. 1, pp. 167-173. #?

Ribrant, "Reliability performance and maintenance—a survey of failures in wind power system," M. S. Thesis, KTH School of Electrical Engineering, Stockholm, Sweden, 2006.

Saleh et al., "Wavelet-based signal processing method for detecting ice accretion on wind turbines," IEEE Trans. Sustainable Energy, 2012, vol. 3, No. 3, pp. 585-597.

Saramov et al., "Nonuniform synchronous sampling analog interface," in Proc. 29th Int. Spring Seminar on Electronics Technology, 2006, pp. 329-333.

(56) References Cited

OTHER PUBLICATIONS

Schulte et al., "A fuzzy impulse noise detection and reduction method," IEEE Trans. Image Processing, 2006, vol. 15, No. 5, pp. 1153-1162.
Sheng, "Wind turbine gearbox condition monitoring round robin study—Vibration analysis," National Renewable Energy Laboratory, Golden, CO, Tech. Rep. NREL/TP-5000-54530, Jul. 2012.
Tavner et al., "Reliability analysis for wind turbines," Wind Energy, 2007, vol. 10, pp. 1-18.
Teotrakool et al., "Adjustable-speed drive bearing-fault detection via wavelet packet decomposition," IEEE Trans. Instrumentation and Measurement, 2009, vol. 58, No. 8, pp. 2747-2754.
Umehara et al., "Statistical impulse detection of in-vehicle power line noise using hidden Markov model," in Proc. IEEE Int. Symposium on Power Line Communications and its Applications, 2010, pp. 341-346.
Verbruggen, "Wind turbine operation & maintenance based on condition monitoring," Final Report, Energy Research Center of the Netherlands, Apr. 2003, [Online]. Available: www.ecn.nl/docs/library/report/2003/c03047.pdf.
Watson et al., "Condition monitoring of the power output of wind turbine generators using wavelets," IEEE Trans. Energy Convers., 2010, vol. 25, No. 3, pp. 715-721.
Yacamini et al., "Monitoring torsional vibrations of electromechanical systems using stator currents," Journal of Vibration and Acoustics, 1998, vol. 120, No. 1, pp. 72-79.
Yang et al., "Cost-effective condition monitoring for wind turbines," IEEE Trans. Ind. Electron., 2010, vol. 57, No. 1, pp. 263-271.
Bonnardot et al., "Use of the acceleration signal of a gearbox in order to perform angular resampling (with limited speed fluctuation)," Mech. Syst. Signal Process., Jul. 2005, 19: 766-785.
Borghesani et al., "A new procedure for using envelope analysis for rolling element bearing diagnostics in variable operating conditions," Mech. Syst. Signal Process., Jul. 2013, 38: 23-35.
Chow and Hai, "Induction machine fault diagnostic analy-sis with wavelet technique," IEEE Trans. Ind. Electron., Jun. 2004, 51: 558-565.
Combet and Gelman, "An automated methodology for performing time synchronous averaging of a gearbox signal without speed sensor," Mech. Syst. Signal Process., Aug. 2007, 21: 2590-2606.
Emresoy and El-Jaroudi, "Iterative instantaneous frequency estimation and adaptive matched spectrogram," Signal Process., Jan. 1998, 64: 157-165.
Feng and Liang, "Fault diagnosis of wind turbine planetary gearbox under nonstationary conditions via adaptive optimal kernel time-frequency analysis," Renewable Energy, Jun. 2014, 66: 468-477.
Feng et al., "Iterative generalized synchrosqueez-ing transform for fault diagnosis of wind turbine planetary gearbox un-der nonstationary conditions," Mech. Syst. Signal Process., Feb. 2015, 52-53: 360-375.
Frosini and Bassi, "Stator current and motor efficiency as indicators for different types of bearing faults in induction motors," IEEE Trans. Ind. Electron., Jan. 2010, 57: 244-251.
Fyfe and Munck, "Analysis of computed order tracking," Mech. Syst. Signal Process., Mar. 1997, 11: 187-205.
Jin et al., "Motor bearing fault diagnosis using trace ratio linear discriminant analysis," IEEE Trans. Ind. Electron., May 2014, 61: 2441-2451.
Kwok and Jones, "Improved instantaneous frequency estima-tion using an adaptive short-time Fourier transform," IEEE Trans. Signal Process., Oct. 2000, 48: 2964-2972.
Lacey, "An overview of bearing vibration analysis," Maintenance Asset Manage., Nov./Dec. 2008, 23: 32-42.
Luo and Liang, "Application of multi-scale chirplet path pursuit and fractional Fourier transform for gear fault detection in speed up and speed-down processes," J. Sound Vib., Oct. 2012, 331: 4971-4986.
Qiao and Lu, "A survey on wind turbine condition monitoring and fault diagnosis—Part I: Components and subsystems," IEEE Trans. Ind. Electron., Oct. 2015, 62: 6536-6545.
Randall and Antoni, "Rolling element bearing diagnostics—A tutorial," Mech. Syst. Signal Process., 2011, 25: 485-520, 2011.
Simani et al., "Fault diagnosis of a wind tur-bine benchmark via identified fuzzy models," IEEE Trans. Ind. Electron., Jun. 2015, 62: 3775-3782.
Villa et al., "Angular resampling for vibration analysis in wind turbines under non-linear speed fluctuation," Mech. Syst. Signal Process., Aug. 2011, 25: 2157-2168.
Wang et al., "Rotating speed isolation and its application to rolling element bearing fault diagnosis under large speed variation conditions," J. Sound Vib., Jul. 2015, 348: 381-396.
Wang et al., "Rolling element bearing fault diagnosis via fault characteristic order (FCO) analysis," Mech. Syst. Signal Process., Mar. 2014, 45: 139-153.
Wang et al., "A new synthetic detection technique for trackside acoustic identification of railroad roller bearing defects," Appl. Acoust., Nov. 2014, 85: 69-81.
Xie et al., "An advanced PLS approach for key performance indicator related prediction and diagnosis in case of outliers," IEEE Trans. Ind. Electron., Apr. 2016, 63: 2587-2594.
Yin et al., "Data-driven process monitoring based on modified orthogonal projections to latent structures," IEEE Trans. Control Syst. Technol, Jul. 2016, 24: 1480-1487.
Yin et al., "Real-time implementation of fault-tolerant control systems with performance optimization," IEEE Trans. Ind. Electron., May 2014, 61: 2402-2411.
Zhao et al., "A review on position/speed sen-sorless control for permanent magnet synchronous machine-based wind energy conversion systems," IEEE J. Emerg. Sel. Topics Power Electron., Dec. 2013, 1: 203-216.
Zhao et al., "A tacho-less order tracking technique for large speed variations," Mech. Syst. Signal Process., Oct. 2013, 40: 76-90.
Zhao et al., "Tacholess envelope order analysis and its application to fault detection of rolling element bearings with varying speeds," Sensors, Aug. 2013, 13: 10856-10875.
Zhou et al., "Bearing fault detection via stator current noise cancellation and statistical control," IEEE Trans. Ind. Electron., Dec. 2008, 55: 4260-4269.

\* cited by examiner

DETECTING FAULTS IN WIND TURBINES

CROSS-REFERENCE TO RELATED APPLICATIONS

This application claims priority under 35 U.S.C. § 119(e)(1), to U.S. Provisional Application Ser. No. 61/652,396, filed on May 29, 2012, the entire contents of which are incorporated herein.

FEDERALLY SPONSORED RESEARCH OR DEVELOPMENT

This invention was made with government support under Grant No. DE-EE0001366 awarded by Department of Energy. The government has certain rights in the invention.

TECHNICAL FIELD

This disclosure relates to detecting faults produced by wind turbine generators.

BACKGROUND

Wind turbines generate a clean and renewable resource that can be used to provide sustainable electricity to the world. The reliability of such wind turbines can be a direct correlation to proper installation and maintenance of the turbines. This reliability can be improved upon by using various condition monitoring methods to ensure device functionality. For example, detecting broken blades before the entire wind turbine malfunctions can ensure that damage to other wind turbine components is minimized.

Detecting faults in wind turbines before damage occurs to other components can increase the lifespan and/or energy output capabilities of the turbine. Conventional fault detection techniques typically include using sensors and data acquisition devices that can monitor the operation of the wind turbines or components in the wind turbines. These sensors can be mounted on the surface or buried in the body of wind turbine components. During typical use, the sensors and turbines can be subject to failure due to poor working conditions, which could cause additional problems with system reliability and additional operating and maintenance costs. Early detection of possible failures can ensure that such failures occur less often.

SUMMARY

Methods and systems are described for detecting wind turbine generator faults by analyzing generator current measurements. Frequency and amplitude demodulation, resampling, frequency spectrum analysis, and impulse detection are used to discover and isolate one or more fault components of the current and to generate a fault identifier. In general, the measured current can be analyzed through the use of signal processing techniques to determine whether or not a fault or failure is present in the wind turbine generator, or alternatively, in the wind turbine itself. In some implementations, there are challenges to using current measurements for fault detection of wind turbine generators. First, the characteristic frequencies of faults depend on the shaft rotating frequency of the wind turbine generator (i.e., the 1P frequency). Since the 1P frequency of a wind turbine generator typically varies with the wind speed during wind turbine generator operation, it may be difficult to extract fault signatures directly from the non-stationary current measurements of the wind turbine generator by using traditional frequency spectrum analysis methods that have been well developed for fault detection of rotating machines. Moreover, the dominant components of current measurements are the fundamental-frequency component and associated harmonics. Therefore, the usable information in current measurements for wind turbine generator fault detection typically has a low signal to noise ratio, which can make fault detection more difficult.

In one implementation, a wind turbine generator fault detection method is described. The method includes acquiring current data from a wind turbine generator during operation and determining frequency demodulated signals and amplitude demodulated signals by frequency demodulating and amplitude demodulating the current data. The method may also include resampling the frequency and amplitude demodulated signals corresponding to the current data. The resampling can include converting a variable 1P frequency to a constant value, and converting one or more variable characteristic frequencies of at least one identified wind turbine generator fault into one or more constant values. The method may also include monitoring a frequency spectra of the resampled frequency and amplitude demodulated signals corresponding to the current data to identify one or more excitations in the frequency spectra and in response to identifying one or more excitations in the frequency spectra at one or more of the variable fault characteristic frequencies, generating and transmitting an alert that indicates that a wind turbine generator fault is detected.

In certain implementations, the method can include resampling the acquired current data in which the resampling includes converting the variable 1P frequency to a constant value and monitoring a frequency spectra of the resampled current data to detect a wind turbine generator fault. In some implementations, the wind turbine generator fault is a fault having one or more characteristic frequencies.

In some implementations, acquiring current data from the wind turbine generator during operation includes measuring one phase of a stator or rotor current in the wind turbine generator. In some implementations, the method can include using the frequency demodulated signal corresponding to the current data to calculate a shaft rotating frequency of the wind turbine generator.

In certain implementations, the method can include using upsampling and downsampling techniques to resample the frequency and amplitude demodulated signals corresponding to the current data. In some implementations, the upsampling techniques include using a constant upsampling ratio to upsample the frequency and amplitude demodulated signals corresponding to the current data. In certain, the method can further include using a variable downsampling step size to downsample the upsampled frequency and amplitude demodulated signals corresponding to the current data, in which the downsampling step size is based at least in part on an estimated shaft rotating frequency of the wind turbine generator.

In some implementations, the downsampling step size is selected to ensure that the sampling frequency of the resampled signals is greater than twice the wind turbine generator fault characteristic frequency.

In some implementations, identifying an excitation in the frequency spectra at one of the fault characteristic frequencies can include implementing an impulse detection method to discover and isolate a fault component of the at least one identified wind turbine generator fault. In certain implementations, monitoring the frequency spectra of the resampled frequency and amplitude demodulated signals can include iteratively calculating the frequency spectra of the resampled frequency and amplitude demodulated signals corresponding to the current data. In some implementations, the method can also include locally normalizing the frequency spectra of the resampled frequency and amplitude demodulated signals corresponding to the current data. In some implementations, the method may include using a median filter to calculate a threshold to determine the excitations in the locally normalized frequency spectra of the resampled frequency and amplitude demodulated signals corresponding to the current data.

In another implementation, a controller configured to detect wind turbine generator faults is described. The controller includes a processor programmed to receive a set of real-time operating current data from a wind turbine generator during operation, determine frequency demodulated signals and amplitude demodulated signals by frequency demodulating and amplitude demodulating the current data, estimate a shaft rotating frequency of the wind turbine generator based on the frequency demodulated signal corresponding to the current data, resample the frequency and amplitude demodulated signals of the current data based on the estimated shaft rotating frequency of the wind turbine generator, calculate frequency spectra of the resampled frequency and amplitude demodulated signals corresponding to the current data, and extract one or more impulses in the frequency spectra to detect any wind turbine generator faults in a frequency domain.

In certain implementations, the processor is further programmed to select a base frequency $f_b$ to be an averaged value of the estimated shaft rotating frequency. In certain implementations, the processor is further programmed to use a moving window to locally normalize the frequency spectra of the resampled frequency and amplitude demodulated signals corresponding to the current data. In certain implementations, the processor is further programmed to select a threshold to determine an impulse by using a median filter.

In some implementations, the controller can include a current sensor configured to generate current data by measuring one or more stator currents of a permanent magnet synchronous generator and measuring one or more rotor currents of a doubly-fed induction generator, a low-pass filter configured to receive the generated current data from the current sensor, and an analog-to-digital converter configured to receive the filtered current data from the low-pass filter.

Advantageously, the described systems and techniques may provide for one or more benefits, such as a computationally efficient, highly sensitive current-based technique for using current measurements in online fault detection of wind turbine generators which are operating in non-stationary conditions.

The details of one or more implementations are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

Figure 1A:
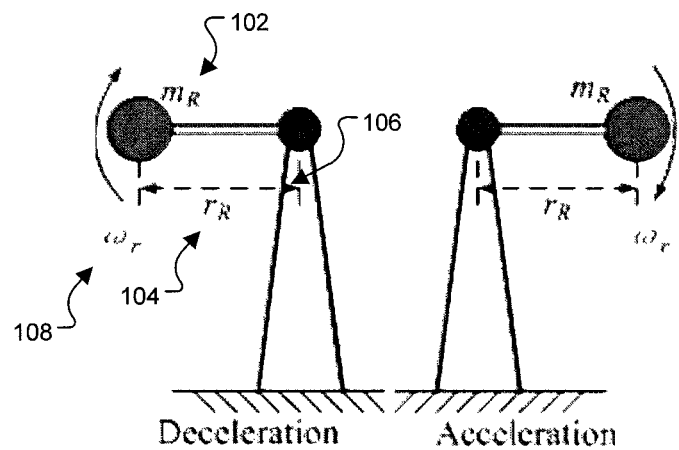
FIGS. 1A-1B are conceptual diagrams showing example effects of faults in wind turbines.

Wind power generation systems may be implemented to provide power to users connected to the power grid. These systems can be prone to faults or failures over time based on a number of environmental factors as well as component failure or wear in wind turbines or other mechanisms associated with the wind power generation system. In general, the systems and techniques described in this document can monitor wind turbine conditions and detect wind turbine faults using efficient and highly sensitive signal processing methods performed when the wind turbines are operating in non-stationary conditions. The monitoring can include, but is not limited to, vibration monitoring, current monitoring, temperature monitoring, chemical analysis, acoustic emission monitoring, sound pressure monitoring, and laser monitoring. Further analysis can be performed on data collected from any or all of the monitoring described above and such analysis can be used to preemptively discover failures occurring in one or more components of the wind power generation system.

Implementing fault detection mechanisms for wind turbines and/or the generators that operate the turbines can include the use of direct measurements, sensor output, and/or analysis of both. The direct measurements can include measurement of signals, inputs, or outputs produced by the turbine components. One example direct measurement can include measuring the current from the generator for a particular wind turbine. Current-based fault detection methods typically measure current used by a control system that operates a wind turbine or current in the generator itself. These current measurements are generally reliable and easily accessible from the ground level without intruding upon the wind turbine generators that are situated on high towers and/or installed in remote areas. The measured current can be analyzed through the use of signal processing techniques to determine whether or not a fault or failure is present in the wind turbine.

Various signal processing techniques can be used to detect faults with characteristic frequencies (e.g., imbalance faults) in wind turbine generators. Example techniques can include classical frequency spectrum analysis, bicoherence analysis, time-frequency analysis, amplitude demodulation, and data mining. In certain implementations, classical frequency spectrum analysis and bicoherence analysis can identify imbalance faults based on known characteristic frequencies. For example, classical spectrum analysis has been applied to detect mass imbalance and aerodynamic asymmetry faults of a wind turbine based on the magnitudes of the 1P frequency components in the frequency spectra of the generator and tower vibration signals acquired from the wind turbine. In certain implementations, the time-frequency analysis and amplitude demodulation methods are able to extract fault signatures from non-stationary signals. For example, continuous wavelet transform, which is a time-frequency method, has been used for blade damage detection of a wind turbine using multiple non-stationary signals acquired from different points of the damaged blade. However, time-frequency analysis and amplitude demodulation methods may not clearly identify imbalance faults from interferences that have similar patterns as the faults in the time or frequency domain. This is because time-frequency analysis and amplitude demodulation methods have a relatively lower resolution in the frequency domain compared to frequency spectrum analysis methods. In certain implementations, data mining can be applied for wind turbine condition prediction using collected maintenance records.

In various implementations of the systems described in this document, sensors can also be used to monitor conditions, trigger other sensors, or simply alert personnel that a fault or failure has been detected. Example sensors can include anything from a temperature sensor to a vibration sensor. Such sensors are selected depending on a number of factors associated with the wind power generation system and the types of faults that can occur. For example, factors for sensor selection can include particular accuracy requirements, range/resolution requirements, environmental conditions that the sensor will incur, and cost, just to name a few. Example sensors can include accelerometers, temperature sensors, pressure/flow sensors, level sensors, proximity sensors, biosensors, image sensors, chemical sensors, and/or mechanical sensors including MEMS (microelectromechanical sensors).

Figure 1B:
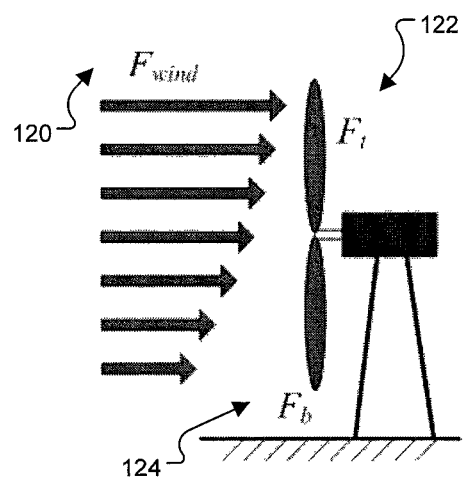

FIGS. 1A-1B are conceptual diagrams showing example effects of faults in wind turbines. In general, imbalance faults constitute a significant portion of all faults in wind turbine generators. A common imbalance fault in wind turbine generators includes a shaft or blade imbalance. A blade imbalance can be caused by errors in manufacturing and construction, icing, deformation due to aging, or wear and fatigue during the operation of the wind turbine generator. In some implementations, blade imbalances occur because certain components tend to shift and wear to varying degrees over time. When an imbalance fault occurs on the shaft of a wind turbine generator, an additional force can be induced in the shaft. In the case of blade imbalance where the mass distribution of one blade is different from the mass distribution of the other blades, a rotor mass imbalance can occur, which may induce vibrations in the shaft rotating speed of the wind turbine generator. When a blade imbalance fault occurs on the shaft of a wind turbine generator, a torque variation will be induced in the shaft, which in turn can induce vibrations in the shaft rotating frequency of the wind turbine generator and generate vibrations of the generator. These vibrations can lead to faults in the wind turbine.

As shown in FIG. 1A, the effect generated by a blade imbalance fault is illustrated with respect to deceleration and acceleration. In this example, $m_R$ 102 represents an equivalent imbalance mass, $r_R$ 104 represents a distance between the equivalent imbalance mass $m_R$ 102 and a center 106 of the shaft, and $\omega_r$ 108 represents an angular shaft rotating speed. In operation, when the equivalent imbalance mass 102 rotates from the top to the bottom of the rotating plane, the power of gravity accelerates the shaft. On the other hand, when the equivalent imbalance mass 102 rotates from the bottom to the top of the rotating plane, the power of gravity decelerates the shaft. Consequently, the shaft rotating speed vibrates at the 1P frequency, where 1P represents one power peak per revolution. This resulting vibration may represent a blade imbalance fault.

Due to a larger stiffness in the vertical direction and a smaller stiffness in the horizontal direction of the wind turbine generator, the wind turbine generator will have more resistance to deformation or vibration in the vertical direction than in the horizontal direction, in response to the centrifugal force generated by the imbalance mass. Therefore in some implementations, the vibration of the wind turbine generator due to the centrifugal force generated by the imbalance mass is mainly in the horizontal direction at the 1P frequency. This type of imbalance mass is typically known as an aerodynamic asymmetry between blades.

Referring to FIG. 1B, the effect of an aerodynamic asymmetry caused by wind shear is depicted. As shown, $F_{wind}$ 120 represents a force of the wind flow affected on the blades of the wind turbine generator; $F_t$ 122 represents a force of the wind flow affected on a blade that is on the top of the rotating plane; $F_b$ 124 represents a force of the wind flow affected on the blade that is on the bottom of the rotating plane. The amplitude of $F_t$ 122 will generally be greater than that of force $F_b$ 124 due to the effect of wind shear, which follows the following power law of $U(z)/U(z_r)=(z/z_r)^\alpha$, where $U(z)$ and $U(z_r)$ represent wind velocities at a height z and a reference height $Z_r$, respectively and α represents the power law exponent. The power law exponent defines a relationship between wind speeds at a first height and wind speeds at other heights.

In operation, a blade will generally have the largest acceleration caused by $F_t$ 122 and the smallest acceleration caused by $F_b$ 124. Therefore, a vibration at the 3P frequency is produced in the shaft speed by wind shear in a balanced wind turbine with three blades. In the case of an aerodynamic asymmetry, a blade of the turbine will have a different $F_t$ 122 and $F_b$ 124 from the other two blades. As a result, the acceleration and deceleration of the imbalanced blade produce a vibration at the 1P frequency in the shaft speed. If, instead, the other two blades have different $F_t$ 122 and $F_b$ 124 frequencies from the imbalanced blade, a vibration may also appear at the 2P frequency in the shaft speed signal. In general, characteristic frequencies of shaft and/or blade imbalance and aerodynamic asymmetry both appear at the 1P frequency in the shaft speed signal of a wind turbine. Therefore, the excitations of the shaft speed signal at the 1P frequency can be used as a signature for imbalance fault detection. Signal excitations that occur because of a blade imbalances and/or aerodynamic asymmetries will be discussed in further detail below.

Systems and methods described in this document can analyze current signals, vibrations, and other signals associated with wind turbine generators to determine one or more wind turbine generator faults. As an example, theoretical characteristic frequencies in a ball bearing (not shown) may include four types of single-point defects in vibration measurements. These defects can be represented by the following equations (1)-(4).

$$f_i = 0.5 \cdot N_B \cdot f_r \cdot (1 + D_b \cdot \cos \vartheta / D_c) \qquad (1)$$

$$f_o = 0.5 \cdot N_B \cdot f_r \cdot (1 - D_b \cdot \cos \vartheta / D_c) \qquad (2)$$

$$f_b = 0.5 \cdot f_r \cdot (D_c/D_b) \cdot (1 - (D_b \cdot \cos \vartheta / D_c)^2) \qquad (3)$$

$$f_c = 0.5 \cdot f_r \cdot (1 - D_b \cdot \cos \vartheta / D_c) \qquad (4)$$

where $f_i$ represents the characteristic frequency of an inner-race defect in a ball bearing (not shown), $f_o$ represents the characteristic frequency of an outer-race defect in the ball bearing, $f_b$ represents the characteristic frequency of a ball defect in the ball bearing, $f_c$ represents the characteristic frequency of a cage defect in the ball bearing; $f_r$ is the rotating frequency of the bearing, which can represented similarly to the 1P frequency of a wind turbine generator. In addition, $N_B$ represents the number of balls in the ball bearing.

Modulation of Current Signals in Wind Turbine Generator Faults

As an example, suppose that a wind turbine generator fault leads to a vibration, and therefore a shaft torque variation in the generator at a frequency of $f_{fault}$. The wind turbine generator current signals are frequency and amplitude modulated by the shaft torque variation at the corresponding characteristic frequency $f_{fault}$, which is shown in the analysis below.

The shaft torque of a wind turbine generator with a fault can be modeled by T(t).

$$T(t)=T_0(t)+T_v \cdot \cos(2\pi f_{fault} \cdot t) \quad (5)$$

In equation (5), t represents a time index, T represents the torque on the wind turbine shaft, $T_0$ represents the torque due to wind power, and $T_v$ represents the amplitude of the shaft torque variation created by the wind turbine generator fault. The shaft torque variation has a characteristic frequency of $f_{fault}$, which can be assumed to be constant in steady-state operation of the wind turbine generator. The steady-state operation may be represented by a state in which the shaft speed varies slowly due to variable wind power.

A shaft system of the wind turbine generator may be represented by a one-mass model in which the motion equation is given by the following equations (6) and (7).

$$J \cdot [d\omega_r(t)/dt] = T(t) - T_e(t) - D \cdot \omega_r(t) \quad (6)$$

$$\omega_r(t) = 2\pi \cdot f_r(t) \quad (7)$$

In equations (6) and (7), J represents the total inertia constant of the wind turbine generator, $\omega_r$ represents the angular shaft rotating speed of the wind turbine generator, and $d\omega_r(t)/dt$ represents the angular acceleration. In addition, $T_e$ represents the electric torque of the wind turbine generator and D represents the damping coefficient, which is approximately zero.

If the wind turbine generator with the fault is operated at steady state, the electric torque $T_e$ can be expressed by equation (8) below:

$$T_e(t) = T_{e,0}(t) + T_{e,v} \cdot \cos(2\pi f_{fault} \cdot t + \varphi_e) \quad (8)$$

where $T_{e,0}$ and $T_{e,v}$ represent the electric torques induced by $T_0$ and $T_v$, respectively, $\varphi_e$ represents the phase shift between the torque variations in the shaft and in the generator created by the wind turbine generator fault. The angular shaft rotating speed can be derived from equations (5), (6), and (8) to obtain equations (9), (10), (11), and (12) below.

$$d\omega_r(t)/dt = [T_0(t) - T_{e,0}(t)]/J + T_f \cos(2\pi f_{fault} \cdot t + \varphi_f)/J \quad (9)$$

$$T_f \cos(2\pi f_{fault} \cdot t + \varphi_f) = T_v \cdot \cos(2\pi f_{fault} \cdot t) - T_{e,v} \cdot \cos(2\pi f_{fault} \cdot t + \varphi_e) \quad (10)$$

$$T_f = \{[T_v - T_{e,v} \cdot \cos(\varphi_e)]^2 + [T_{e,v} \cdot \sin(\varphi_e)]^2\}^{1/2} \quad (11)$$

$$\varphi_f = \arctan\{[-T_{e,v} \cdot \sin(\varphi_e)]/[T_v - T_{e,v} \cdot \cos(\varphi_e)]\} \quad (12)$$

The angular shaft rotating speed can then be calculated by integrating the right-hand side of equation (9), which yields equation (13) below.

$$\omega_r(t) = \omega_{r,0} + (1/J) \cdot \int [T_0(t) - T_{e,0}(t)] \cdot dt + (1/J) \cdot \int T_f \cos(2\pi f_{fault} \cdot t + \varphi_f) \cdot dt \quad (13)$$

Equation (13) can be rewritten as shown in equation (14) below:

$$\omega_r(t) = \omega_{r,0} + \omega_{r,w}(t) + \omega_{r,v} \cdot \sin(2\pi f_{fault} \cdot t + \varphi_f) \quad (14)$$

where $\omega_{r,0}$ represents the constant component of the angular shaft rotating speed, $\omega_{r,w}$ represents the angular shaft rotating speed generated by the variable wind power, and represents the amplitude of the excitation in the angular shaft rotating speed due to the wind turbine generator fault. The terms $\omega_{r,w}$ and $\omega_{r,v}$ can be expressed as follows:

$$\omega_{r,w}(t) = (1/J) \cdot \int [T_0(t) - T_{e,0}(t)] \cdot dt \quad (15)$$

$$\omega_{r,v} = 1/(J \cdot 2\pi \cdot f_{fault}) \cdot T_f \quad (16)$$

Using equation (7) above, the shaft rotating frequency of a wind turbine generator with a fault can be modeled as shown in equation (17) below:

$$f_r(t) = f_{r,w}(t) + f_{r,v} \cdot \sin(2\pi f_{fault} \cdot t + \varphi_f) \quad (17)$$

where $f_{r,w}(t)$ and $f_{r,v}$ are represented as shown in equations (18) and (19) below.

$$f_{r,w}(t) = [\omega_{r,0} + \omega_{r,w}(t)]/2\pi \quad (18)$$

$$f_{r,v} = \omega_{r,v}/2\pi \quad (19)$$

In the event that the wind turbine generator system is equipped with a permanent magnet synchronous generator, the relationship between the shaft rotating frequency and the fundamental frequency $f_1$ of the stator current signal can be represented by equation (20) below.

$$f_1(t) = p \times f_r(t) \quad (20)$$

The term p represents the number of pole pairs of the permanent magnet synchronous generator. Using equations (17) and (20), the fundamental frequency of the stator current signal is represented by equation (21) below.

$$f_1(t) = p \cdot f_{r,w}(t) + p \cdot f_{r,v} \cdot \sin(2\pi f_{fault} \cdot t + \varphi_f) \quad (21)$$

Therefore, the stator current signal $C_s$ of the permanent magnet synchronous generator can be modeled as shown in equation (22) below:

$$C_s(t) = I_s(t) \cdot \sin\{2\pi \int [p \cdot f_{r,w}(t) + p \cdot f_{r,v} \cdot \sin(2\pi f_{fault} \cdot t + \varphi_f)] \cdot d\tau\} \quad (22)$$

where the harmonics of the stator current $C_s$ are typically not considered due to their low magnitudes compared to the fundamental-frequency component. The term $I_s$ represents the amplitude of the stator current signal and shows that the stator current signal of a direct-drive permanent magnet synchronous generator wind turbine is frequency modulated by the shaft torque variation generated by the wind turbine generator fault.

The amplitude of the voltage $E_s$ induced in a given stator phase can be represented as shown in equation (23) below.

$$E_s(t) = K \cdot \Phi \cdot f_1(t) \quad (23)$$

where K is a constant representing the structure of the permanent magnet synchronous generator and $\Phi$ is the total flux in the permanent magnet synchronous generator. The amplitude of the phase current $I_s$ is represented in equation (24) below:

$$I_s(t) = E_s(t)/|Z_s(t)| \quad (24)$$

where $Z_s$ is the equivalent complex impedance of the generator stator circuit and the external circuit or load to which the permanent magnet synchronous generator is connected. According to equations (21), (23), and (24), the amplitude of the stator current signal $I_s$ can be presented as shown in equations (25), (26), and (27) below.

$$I_s(t) = I_{s,w}(t) + I_{s,v}(t) \cdot \sin(2\pi f_{fault} \cdot t + \varphi_f) \quad (25)$$

$$I_{s,w}(t) = K \cdot \Phi \cdot p \cdot f_{r,w}(t)/|Z_s(t)| \quad (26)$$

$$I_{s,v}(t) = K \cdot \varphi \cdot p \cdot f_{r,v}/|Z_s(t)| \quad (27)$$

The above equations show that the stator current signal of the permanent magnet synchronous generator is amplitude modulated by the shaft torque variation created by the wind turbine generator fault.

In the event that the wind turbine generator system is equipped with a doubly-fed induction generator, the relationship between the shaft rotating frequency and the electrical frequency $f_{rotor}$ of the rotor current signal is given by equation (28) below:

$$f_{rotor}(t) = p \times f_r(t) - f_{syn} \quad (28)$$

where p represents the number of pole pairs of the doubly-fed induction generator, $f_{syn}$ represents the frequency of the doubly-fed induction generator stator current, which is normally constant at 50 Hz or 60 Hz, for example. Using equations (17) and (28), the electrical frequency of the rotor current signal can be found as shown in equation (29).

$$f_{rotor}(t) = p \cdot f_{r,w}(t) + p \cdot f_{r,v} \cdot \sin(2\pi f_{fault} \cdot t + \varphi_f) - f_{syn} \quad (29)$$

Therefore, the rotor current signal $C_r$ of the doubly-fed induction generator can be modeled as shown in equation (30) below:

$$C_r(t) = I_r(t) \cdot \sin\{2\pi \int [p \cdot f_{r,w}(t) + p \cdot f_{r,v} \cdot \sin(2\pi f_{fault} \cdot t + \varphi_f) - f_{syn}] \cdot dt\} \quad (30)$$

where $I_r$ represents the amplitude of the rotor current signal. This shows that the rotor current signal of a doubly-fed induction generator wind turbine is frequency modulated by the shaft torque variation generated by the wind turbine generator fault.

The amplitude of the induced rotor voltage $E_r$ in a doubly-fed induction generator may be represented by equations (31) and (32) below:

$$E_r(t) = -s \cdot E_{r0} \quad (31)$$

$$s = -f_{rotor}(t)/f_{syn} \quad (32)$$

where s represents the slip of the doubly-fed induction generator, $E_{r0}$ represents the magnitude of the induced rotor voltage at locked-rotor conditions, which is a constant at a given grid voltage level. The amplitude of the doubly-fed induction generator rotor current $I_r$ is represented by equation (33) below:

$$I_r(t) = E_r(t)/|Z_r(t)| \quad (33)$$

where $Z_r$ represents the equivalent complex impedance of the doubly-fed induction generator rotor circuit and the external circuit to which the doubly-fed induction generator rotor windings are connected. According to equations (28), (31), (32), and (33), the amplitude of the rotor current signal $I_r$ can also be represented as shown in equations (34), (35), and (36) below.

$$I_r(t) = I_{r,w}(t) + I_{r,v}(t) \cdot \sin(2\pi f_{fault} \cdot t + \varphi_f) \quad (34)$$

$$I_{r,w}(t) = E_{r0} \cdot [p \cdot f_{r,w}(t) - f_{syn}]/[|Z_r(t)| \cdot f_{syn}] \quad (35)$$

$$I_{r,v}(t) = E_{r0} \cdot p \cdot f_{r,v}/[|Z_r(t)| \cdot f_{syn}] \quad (36)$$

These equations show that the rotor current signal of the doubly-fed induction generator is amplitude modulated by the shaft torque variation created by the wind turbine generator fault.

Current Frequency and Amplitude Demodulation Methods for Fault Detection

In some implementations, wind turbine generator current signals are frequency and amplitude modulated by the vibration generated by a wind turbine generator fault. According to equations (22), (25), (30) and (34) above, the stator current $C_s$ of a permanent magnet synchronous generator and the rotor current $C_r$ of a doubly-fed induction generator can be shown by equations (37) and (38) below.

$$C_s(t) = I_s(t) \cdot \sin[2\pi \int p \cdot f_r(t) \cdot dt] \quad (37)$$

$$C_r(t) = I_r(t) \cdot \sin\{2\pi \int [p \cdot f_r(t) - f_s] \cdot dt\} \quad (38)$$

Therefore, not only frequency demodulation methods can be used to discover the excitations in $f_r(t)$ related to the wind turbine generator fault, but also amplitude demodulation methods can be applied to extract the vibrations in $I_s(t)$ or $I_r(t)$ created by the wind turbine generator fault.

In a wind turbine generator, information representing shaft rotating frequency is typically used for maximum power point tracking control. The shaft rotating frequency can be measured by using a position and/or speed sensor, e.g., an encoder or resolver, or alternatively, can be estimated from the wind turbine generator current measurements using an observer. The shaft rotating frequency is the frequency demodulated signal of current and can be used for wind turbine generator fault detection. A simple method (i.e., using an observer) to demodulate the frequency from current signals may include the phase lock loop method. A phase lock loop is a closed loop frequency control system which generates an output signal whose phase is related to the phase of an input reference signal. Since frequency is the time derivative of phase, keeping the input and output phases in lock step implies keeping the input and output frequencies in lock step. Therefore, a phase lock loop can be used to track the frequency of an input signal.

In some implementations, an amplitude demodulation method can be applied to calculate the variable amplitudes $I_s(t)$ or $I_r(t)$ of current measurements in equations (37) and (38), respectively. For instance, the square law, which is a classical method for amplitude demodulation or envelope detection, can be used to extract the variable amplitudes of the current signals.

According to equation (25), the current signal of a wind turbine equipped with a permanent magnet synchronous generator in equation (37) can be rewritten as shown by equations (39) and (40).

$$C_s(t) = [I_{s,w}(t) + I_{s,v}(t) \cdot \sin(2\pi f_{fault} \cdot t + \varphi_f)] \cdot \sin[\theta(t)] \quad (39)$$

$$\theta(t) = 2\pi \int p \cdot f_r(t) \cdot dt \quad (40)$$

Continuing with the above example, the square law can be applied to the signal $C_s$ as shown by equation (41) below.

$$C_s(t)^2 = \{[I_{s,w}(t) + I_{s,v}(t) \cdot \sin(2\pi f_{fault} \cdot t + \varphi_f)] \cdot \sin[\theta(t)]\}^2 \quad (41)$$

Equation (41) can be rewritten by using trigonometric functions. The components can then be sorted from low frequency to high frequency, as shown by equation (42) below:

$$C_s(t)^2 = [I_{s,w}^2(t)/2 + I_{s,v}^2(t)/4] + I_{s,w}(t) \cdot I_{s,v}(t) \cdot \sin(2\pi f_{fault}(t) \cdot t + \varphi_f) - I_{s,v}^2(t) \cdot \cos[4\pi \cdot f_{fault}(t) \cdot t + 2\varphi_f]/4 + I_{s,v}^2(t) \cdot \cos[2\theta(t) - 4\pi \cdot f_{fault} \cdot t - 2\varphi_f]/8 + I_{s,w}(t) \cdot I_{s,v}(t) \cos[2\theta(t) - 2\pi \cdot f_{fault} \cdot t - \varphi_f]/2 - [I_{s,w}^2(t)/2 + I_{s,v}^2(t)/4] \cdot \cos[2\theta(t)] - I_{s,w}(t) \cdot I_{s,v}(t) \cdot \cos[2\theta(t) + 2\pi \cdot f_{fault} \cdot t + \varphi_f]/2 + I_{s,v}^2(t) \cdot \cos[2\theta(t) + 4\pi \cdot f_{fault} \cdot t + 2\varphi_f]/8 \quad (42)$$

where the current squared signal ($C_s^2$) represents the amplitude demodulated signal of current $C_s$ and the term $I_{s,w}(t) \cdot I_{s,v}(t) \cdot \sin(2\pi \cdot f_{fault}(t) \cdot t + \varphi_f)$ represents an excitation due to the wind turbine generator fault. The term $I_{s,v}^2(t) \cdot \cos[4\pi \cdot f_{fault}(t) \cdot t + 2\varphi_f]/4$ represents the second harmonic of the excitation in $C_s^2$ generated by the wind turbine generator fault. Both terms can be used for fault detection. Since the fundamental frequency is typically the dominant component in stator current signals, the magnitude of $I_{s,w}(t)$ is generally much larger than that of $I_{s,v}(t)$. Therefore, the second harmonic of the excitation generated by the wind turbine generator fault has a low magnitude and can be neglected, in this example.

Since wind turbine generator faults can lead to both frequency and amplitude modulations of current signals, either a frequency or an amplitude demodulation method can discover the effect caused by wind turbine generator fault in current measurements. To improve the accuracy of fault detection and increase the redundancy and reliability of the fault detection system, both the frequency and amplitude demodulation methods can be applied.

In some implementations, current signals can also be used directly for wind turbine fault detection, and the procedure of using current signals for wind turbine fault detection is similar to that of using frequency and amplitude demodulated signals corresponding to the current data. However, using the demodulated signals for wind turbine generator fault detection may provide for several advantages. In particular, using current signals directly in wind turbine generator fault detection processes can result in dispersion of the total energy of the excitations related to faults into multiple characteristic frequencies. For example, if stator current measurements are directly used for wind turbine generator fault detection, the energy of excitations related to wind turbine generator faults will disperse to multiple characteristic frequencies. The magnitudes of excitations at these multiple characteristic frequencies may be less outstanding than that at the only fault characteristic frequency $f_{fault}$ of the current demodulated signals in the frequency domain, for example.

1P-invariant Frequency Spectrum Analysis

Since the fault characteristic frequencies of a wind turbine generator vary with the shaft rotating frequency during variable-speed operating condition of the wind turbine generator, it can be difficult to extract the fault signatures from the non-stationary current signals of the wind turbine generator using classical frequency spectrum analysis methods. However, if a wind turbine generator rotates at a constant frequency, classical frequency spectrum analysis can be used to identify a wind turbine generator fault effectively based on characteristic frequencies. For example, if the wind turbine generator current signals or current demodulated signals are preprocessed in such a way that the variable fault characteristic frequencies of the wind turbine generator are converted into constant values, the classical frequency spectrum analysis methods can be used to detect the faults for a variable-speed wind turbine generator.

In operation, the systems described in this document can begin by defining both a normalized frequency of a current demodulated signal $\Omega_r$ as well a sampling frequency $f_s$ of the current measurement. An example relationship amongst $f_r$, $f_s$, and $\Omega_r$ is shown below by equation (43):

$$\Omega_r(t)/2\pi = f_r(t)/f_s \qquad (43)$$

where $\Omega_r(t)$ is expected to be constant to facilitate the fault detection by using classical frequency spectrum analysis. Therefore, if the sampling frequency $f_s$ is changed continuously with $f_r(t)$ to make the right-hand side of equation (43) constant, $\Omega_r(t)$ will eventually become constant. The above method can include preprocessing the current demodulated signal of a wind turbine generator to obtain a constant $\Omega_r(t)$, which can be implemented in the following example steps, as shown in FIG. 2.

Figure 2:
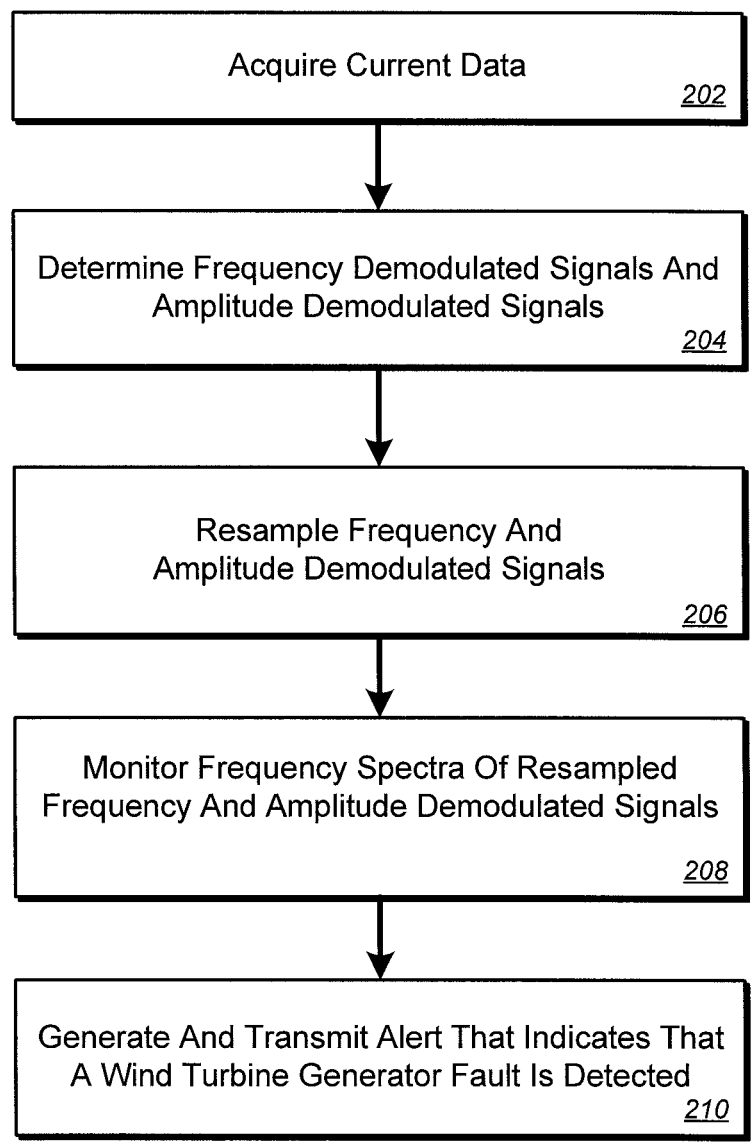
FIG. 2 is a flow chart of a process for identifying a generator fault.

FIG. 2 is a flow chart of a process 200 for identifying a generator fault. In short, process 200 generates an alert in response to detecting a wind turbine generator fault. The fault may be a wind turbine generator fault having one or more characteristic frequencies. For example, the fault may be a wind turbine generator imbalance fault. In general, the process 200 can be performed by a processor, controller, or computer system capable of analyzing complex signals. The mechanism that performs each of the steps in this method will be referred to as a system, but such a system contemplates employing a number of processors, computers, sensors, and/or other peripherals. The process 200 can begin by acquiring (202) current data from a wind turbine generator during operation. For example, the current data can be acquired by a server system from a sensor measuring current from a generator operating the wind turbine. In some implementations, the current data can be acquired during operation of the wind turbine generator by measuring one phase of a stator (i.e., in a permanent magnet synchronous generator) or rotor (i.e., in a doubly fed induction generator) current in the generator.

Upon acquiring the current data, the system determines (204) frequency demodulated signals and amplitude demodulated signals by frequency demodulating and amplitude demodulating the current data. For example, the current data typically includes signals with both amplitude portions and frequency portions. The system can perform demodulation techniques on both the frequency portions and the amplitude portions to retrieve signal information, for example. In some implementations, demodulated signals can be used as inputs when calculating other information used in fault detection of wind turbine generators. For example, the system can use frequency demodulated signal information corresponding to the acquired current data, from step 202, to calculate a shaft rotating frequency of the wind turbine generator that supplied the current data.

At some point during operation, the system can resample (206) the frequency and amplitude demodulated signals corresponding to the current data. The resampling can include using upsampling and/or downsampling techniques on the frequency and/or the amplitude demodulated signals. Such resampling may result in converting one or more variable characteristic frequencies of at least one identified wind turbine generator fault into one or more constant values. For example, the upsampling techniques can include using a constant upsampling ratio to upsample the frequency and amplitude demodulated signals corresponding to the current data. In some implementations, the resampling can include using a variable downsampling step size to downsample the upsampled frequency and amplitude demodulated signals. In particular, the downsampling step size may be based at least in part on an estimated shaft rotating frequency of the wind turbine generator. In some implementations, the downsampling step size may be selected to ensure particular frequency sampling occurs. For example, the system can select a downsampling step size that ensures that the sampling frequency of the resampled signals is greater than twice the wind turbine generator fault characteristic frequency such that each resampled signal can be reconstructed from its countable sequence of samples and contain the fault characteristic frequency (according to the Nyquist-Shannon sampling theorem). In some implementations, the resampling can include resampling the acquired current data directly in addition to resampling the frequency and amplitude demodulated signals. This resampling can include converting the variable 1P frequency to a constant value and monitoring a frequency spectra of the resampled current data to detect a wind turbine generator fault.

The system can monitor (208) a frequency spectra of the resampled frequency and amplitude demodulated signals corresponding to the current data. The monitoring can be performed to identify one or more excitations at the fault characteristic frequency or frequencies in the frequency spectra. An excitation at a fault characteristic frequency in the frequency spectra can indicate a fault has occurred in the wind turbine generator. The fault may be caused by yaw error, wind shear, tower shadow, blade imbalance, or aerodynamic asymmetry, just to name a few examples. Identifying an excitation in the frequency spectra at one of the converted constant fault characteristic frequencies can include implementing an impulse detection method to discover and isolate a fault component of at least one identified wind turbine generator fault. Example impulse detection methods are described with reference to FIG. 5 below.

In some implementations, monitoring the frequency spectra of the resampled frequency and amplitude demodulated signals can include iteratively calculating the frequency spectra of the resampled signals corresponding to the current data. In some implementations, identifying an excitation in the frequency spectra can include locally normalizing the frequency spectra of the resampled frequency and amplitude demodulated signals corresponding to the current data. In certain implementations, identifying an excitation in the frequency spectra can include using a median filter to calculate a threshold to determine the excitations in the locally normalized frequency spectra of the frequency and amplitude demodulated signals corresponding to the current data. In some implementations, the threshold level is predetermined by the system. In other implementations, each wind turbine generator is set to a unique threshold level.

In response to identifying one or more excitations in the frequency spectra at the converted constant fault characteristic frequencies, the system can generate (210) and transmit an alert message that indicates that a wind turbine generator fault has been detected. The alert can be presented at or near the wind turbine, or alternatively sent to a server system to be analyzed.

Figure 3:
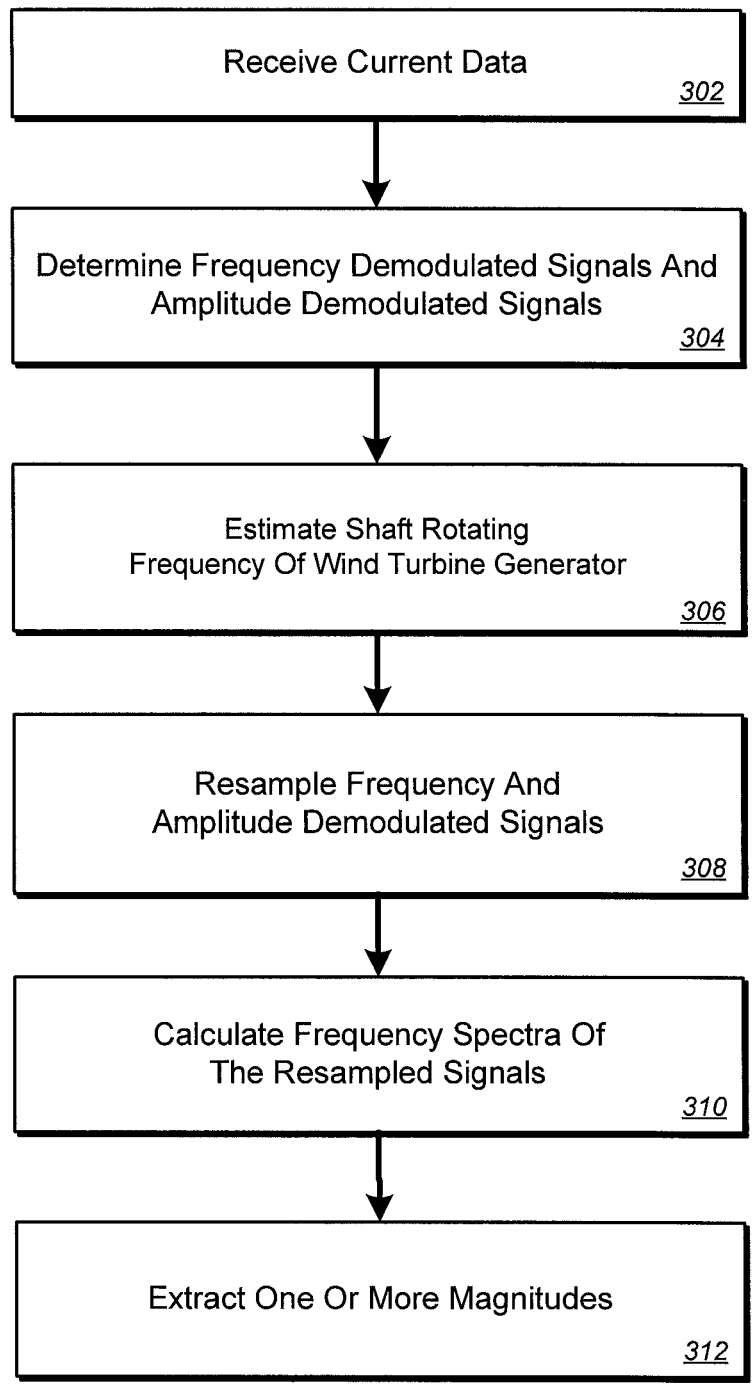
FIG. 3 is a flow chart of a process for detecting one or more impulses in a frequency spectrum.

FIG. 3 is a flow chart of a process 300 for detecting one or more impulses in a frequency spectrum. The process 300 can, for example, be performed by a controller configured to detect wind turbine generator faults. The controller can include a current sensor configured to generate current data by measuring one or more stator currents of a permanent magnet synchronous generator and measuring one or more rotor currents of a doubly-fed induction generator. The controller can also include a low-pass filter configured to receive the generated current data from the current sensor and an analog-to-digital converter configured to receive the filtered current data from the low-pass filter.

The process can begin by receiving (302) a set of real-time operating current data from a wind turbine generator during operation. The received current data can be used to determine (304) frequency demodulated signals and amplitude demodulated signals by demodulating the current data.

The system can estimate (306) a shaft rotating frequency of the wind turbine generator based on the frequency demodulated signal corresponding to the current data. In some implementations, the system (or a user) may select a base frequency $f_b$ to be an averaged value of the estimated shaft rotating frequency during a certain period. In this way, the quantization error due the variable downsampling rate will be minimized.

The system can resample (308) the frequency and amplitude demodulated signals of the current data based on the estimated shaft rotating frequency of the wind turbine generator and calculate (310) frequency spectra of the resampled frequency and amplitude demodulated signals corresponding to the current data. In some implementations, the processor may be further programmed to use a moving window to locally normalize the frequency spectra of the resampled frequency and amplitude demodulated signals corresponding to the current data.

The system can extract (312) magnitudes of one or more impulses in the frequency spectra to detect any wind turbine generator faults. The extracted magnitudes of the impulses can be used as an index to detect wind turbine generator faults in the frequency domain. In some implementations, the system can select a threshold to determine an impulse by using a median filter. The threshold can be automatically generated by setting its value to be the maximum value of the output signal of the median filter. If the magnitude of the locally normalized frequency spectrum of the resampled frequency or amplitude demodulated signal corresponding to the current data is greater than the threshold at a certain frequency point, it indicates that there is an impulse at that frequency.

Figure 4:
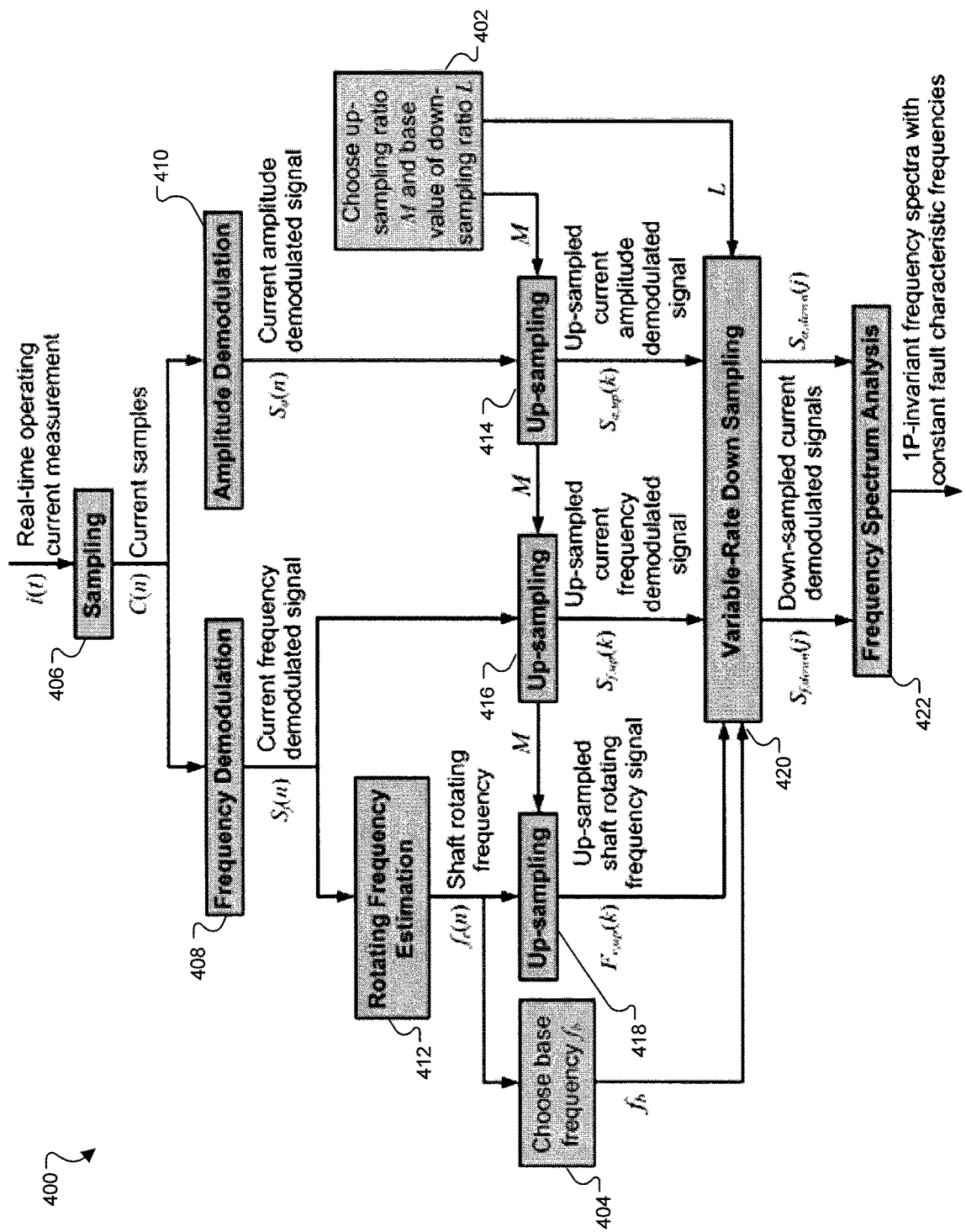
FIG. 4 is a flow chart of a process for performing a frequency spectrum analysis.

FIG. 4 is a flow chart of an example process 400 for performing a frequency spectrum analysis. The process 400 performs the analysis using the 1P-invariant frequency. In operation, the process 400 may begin by receiving real-time operating current measurements i(t). The process 400 can also include receiving or selecting particular predetermined variables that can be applied during resampling or demodulation techniques. For example, the process 400 can include receiving (402) user input that selects an upsampling ratio M. In addition, the process 400 can also include selecting or receiving a base value of a downsampling step size of L. The process 400 can additionally include receiving or selecting (404) a base frequency $f_b$. For example, the system (or a user) may select a base frequency $f_b$ to be an averaged value of an estimated shaft rotating frequency during a certain period.

As shown in FIG. 4, the real-time operating current measurements i(t) can be sampled (406) to obtain current samples C(n), where n=1, 2, 3, . . . , N and N is the length of the current measurement. The sampling generally includes sampling of measured non-stationary current i(t) of the wind turbine generator with a fixed sampling rate.

The process 400 includes demodulating the frequency (408) and demodulating the amplitude (410) of the non-stationary current signal C(n). The demodulation results in a current frequency demodulated signal $S_f(n)$ and a current amplitude demodulated signal $S_a(n)$.

For the frequency demodulated signal $S_f(n)$, the process 400 includes estimating (412) the shaft rotating frequency $f_r(n)$ by using the current frequency demodulated signal $S_f(n)$. The process may include choosing (404) a base frequency $f_b$ based on $f_r(n)$. Alternatively, the base frequency may be predetermined before the demodulation occurs. In an example of a permanent magnet synchronous generator, the shaft rotating frequency can be represented by the equation $f_r(n)=s_f(n)/p$. For a doubly-fed induction generator, the shaft rotating frequency can be represented by the equation $f_r(n)=[s_f(n)+f_{sym}]/p$. Here p is the number of pole pairs of the generator.

For the amplitude demodulated signal $S_a(n)$, the previously selected upsampling ratio M and a base value of downsampling ratio L is selected (402). The process can include upsampling (414-418) which may represent interpolating the shaft rotating frequency $f_r(n)$, the frequency demodulated signal $s_f(n)$, and the amplitude demodulated signal $s_a(n)$ by a constant upsampling ratio of M. The results are represented by the upsampled shaft rotating frequency signal $F_{r,up}(k)$, the upsampled current frequency demodulated signal $S_{f,up}(k)$, and the upsampled current amplitude demodulated signal $S_{a,up}(k)$, where k=1, 2, 3, . . . , M×N.

Next, the process 400 includes a variable rate downsampling (420). For example, the process can downsample $S_{f,up}(k)$ and $S_{up}(k)$ by a variable downsampling step size. The results may include $S_{f,down}(j)$ and $S_{a,down}(j)$, respectively, where j=1, 2, 3, ..., J and J is determined by M, N, and L. Suppose that s(n) stands for $s_f(n)$ or $s_a(n)$ and $S_{down}(j)$ stands for $S_{f,down}(j)$ or $S_{a,down}(j)$ and $S_{up}(k)$ stands for $S_{f,up}(k)$ or $S_{a,up}(k)$. In the downsampling process, equations (44) and (45) are rendered as:

$$S_{down}(1)=S_{up}(1) \quad (44)$$

If $S_{down}W=S_{up}(k)$, then, $$S_{down}(j+1)=S_{up}(k+\text{round}[L\cdot f_b/f_{r,up}(k)]) \quad (45)$$

where round $[L\cdot f_b/f_{r,up}(k)]$ is the variable downsampling step size, which depends on the upsampled shaft rotating frequency $f_{r,up}(k)$. In addition, round(•) stands for rounding a number to the nearest integer. The downsampling process to obtain $S_{down}(j)$ is equivalent to resampling the original or upsampled current demodulated signal [s(n) or $S_{up}(k)$, respectively] with a variable sampling frequency $f_s(k)$, whose value is proportional to the value of $f_{r,up}(k)$. According to equation (43) above, the normalized frequency of $S_{down}(j)$, which is $\Omega_{down}(j)$, is given by the following equation $\Omega_{down}(j)/2\pi=s_{down}(j)/f_s(j)$, where $\Omega_{down}(j)$ is now a constant value.

The process 400 includes calculating (422) the classical frequency spectrum of the downsampled current demodulated signal $S_{down}(j)$ for the fault signature extraction, which now has a constant characteristic frequency. By using the above method 400, the variable 1P frequency of the wind turbine generator and variable characteristic frequency $f_{fault}$ of a wind turbine generator fault become constant values in the frequency spectrum of $S_{down}(j)$. Therefore, the resulting frequency spectrum is called the 1P-invariant frequency spectrum and the magnitude of the excitation at $f_{fault}$ in the frequency spectrum of $s_{down}(j)$ can be used as a signature to clearly identify and quantify wind turbine generator faults.

In some implementations of method 400, the constant base value of the downsampling step size L is chosen based on two criteria. First L should be large enough to eliminate the quantization error due to the requirement of an integral downsampling step size. Second, L should be small enough to ensure that the sampling frequency after downsampling is greater than twice the $f_{fault}$ frequency. In one example, L is larger than 10. The base frequency $f_b$ is chosen to be the mean value of the estimated shaft rotating frequency $f_r(n)$. Furthermore, if the measured current is sampled with a sufficiently high sampling rate, as in step 406, such that the sampling frequency of the downsampled signal $S_{down}(j)$ without using upsampling is greater than twice the characteristic frequency of the wind turbine generator fault, then M is 1 and the upsampling steps 414-418 can be excluded.

Impulse Detection for the 1P-invariant Frequency Spectra

Figure 5:
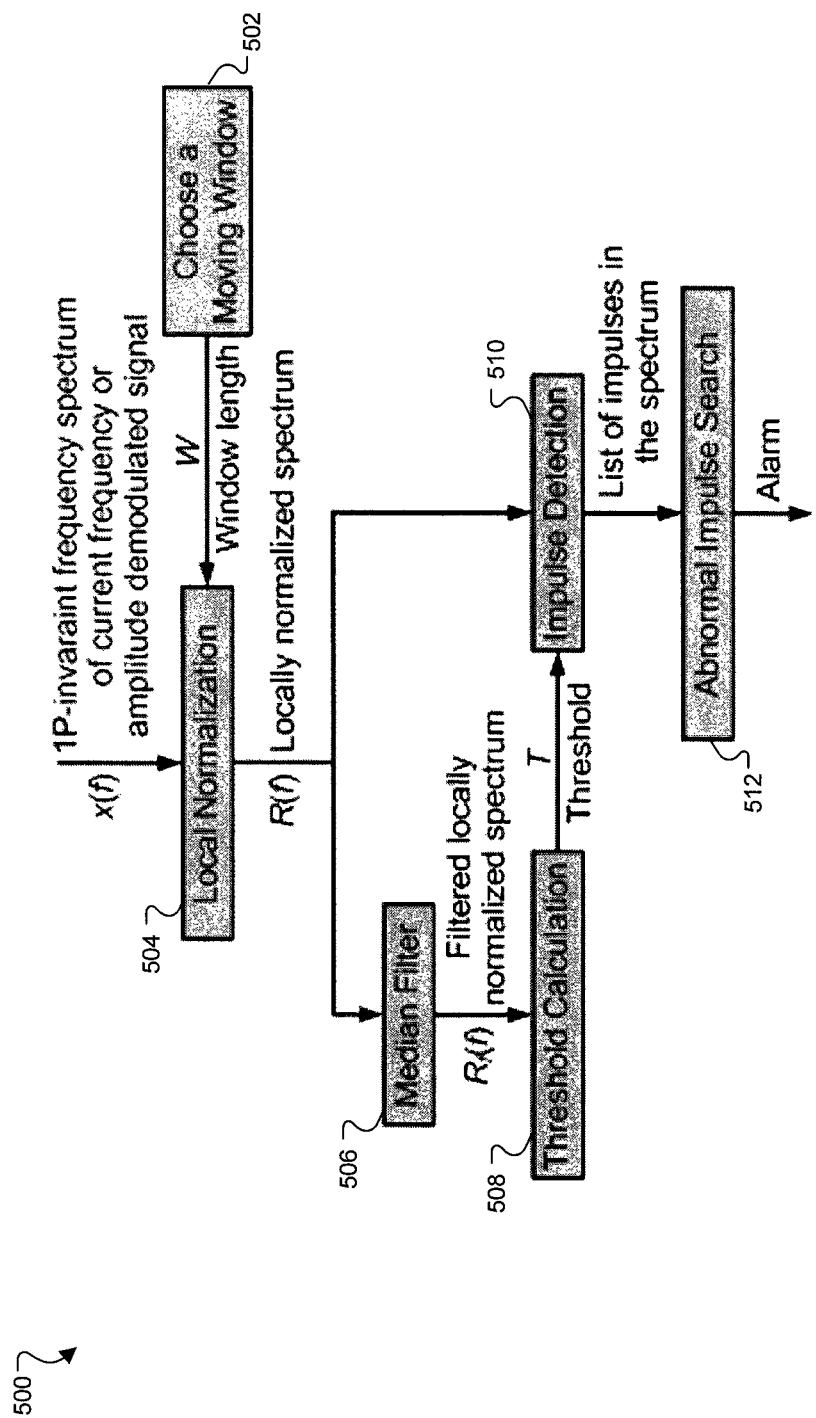
FIG. 5 is a flow chart of a process for detecting faults in wind turbine generators.

FIG. 5 is a flow chart of a process 500 for detecting faults in wind turbine generators. The process 500 provides an impulse detection algorithm for automatic extraction of fault signatures from the 1P-invariant frequency spectra. The 1P-invariant frequency spectra of the current demodulated signals usually have non-stationary amplitudes. Therefore, a localized process for impulse detection from the frequency spectra is employed. In a 1P-invariant frequency spectrum, the magnitude at one frequency represents the energy of the time-domain signal at that frequency. If the energy around a certain frequency is high, it will generate an impulse in the frequency spectrum. The impulse detection method is proposed based on the amplitude of a 1P-invariant frequency spectrum.

In this example, assume that x(f) represents the sampled 1P-invariant frequency spectrum of a current demodulated signal, where f=1, 2, 3, ... F and F is the length of x(f). The process 500 includes defining the energy of x(f) as $P_x(f)=x(f)$ and selecting (502) a moving window W. If the moving window W is of length 2W+1 is used, the energy of the data in the window can be defined as $P_W=x(f-W)+x(f-W+1)++x(f+W)$. A ratio R(f) is defined to present the percentage of the energy at the frequency f with respect to the total energy of the points contained in the moving window $R(f)=P_x(f)/P_W$. In some implementations, the system can use a moving window to locally normalize the frequency spectra of particular resampled frequency and amplitude demodulated signals.

The process 500 includes locally normalizing (504) x(f) resulting in R(f), which represents a locally normalized spectrum of the original frequency-domain signal x(f). If R(f) at a certain frequency point is greater than a predetermined threshold T, it can indicate that there is an impulse at that frequency. In operation, the threshold T is automatically generated from the 1P-invariant frequency spectrum.

The process 500 includes filtering (506) R(f) using a median filter, which is a nonlinear filter, to remove the impulse. The filtered R(f) is represented by $R_f(f)$, which is the result of R(f) processed by the median filter. The process 500 includes selecting a threshold T by performing (508) a threshold calculation. The threshold T is generally set to be the maximum value of $R_f(f)$. If an impulse is detected (510) at a fault characteristic frequency $f_{fault}$ in the locally normalized frequency spectrum of $S_{down}(j)$, it indicates that one or more components of the wind turbine generator have a fault. This is typically an abnormal condition and as such, the process 400 can determine the abnormal condition by performing (512) an abnormal impulse search and if the impulse is indeed abnormal, the process 400 can issue an alarm or message indicating the abnormal condition.

Although the various actions in FIGS. 2-5 have been shown in a linear grouping as one example, the particular determinations made in the process and the order of those determinations may vary depending on the implementation.

The following examples of experimental studies include use of a direct-drive wind turbine generator. The generator includes six pole pairs and is operated in a wind tunnel. The wind tunnel can use a variable-speed fan to generate controllable wind flows with speeds from 0 to 10 m/s. In the experimental studies, the rotating speed of the fan is varied to generate variable wind speed in the wind tunnel. One phase stator current of the wind turbine generator is recorded via a current clamp and data acquisition system at a sampling rate of 10 kHz. The current samples are acquired by the software operating on a computing system. The length of each current record is 60 seconds.

Example: Blade Imbalance Detection

To create a blade imbalance, additional masses are added close to the tip of a blade of the wind turbine generator. The mass of a healthy blade is measured to be 181 grams. Four blade imbalance scenarios are tested by adding a mass of 2.3 grams, 4.5 grams, 6.8 grams, and 9 grams, respectively, to a blade. Therefore, the weight of the blade is increased by 1.25%, 2.5%, 3.75%, and 5%, respectively. During the experiments, the wind turbine generator is operated at variable speeds in the range of 6-13 Hz, which represents the variable 1P frequency. The proposed methods above are applied to obtain the 1P-invariant Power Spectral Density (PSD) of the estimated shaft rotating frequency of the wind turbine generator for the four blade imbalance scenarios and the baseline case. In the proposed methods, the base frequency $f_b$ is chosen to be 10 Hz and the base value of the downsampling step size L is 100. In the experiments, excitations are observed at the fixed 1P frequency of 10 Hz in the 1P-invariant PSD plots in the blade imbalance scenarios. Thus, the magnitude of this excitation provides an effective index for detecting blade imbalance faults. The greater the magnitude of the excitation appears at the 1P frequency, the higher degree of the blade imbalance. Therefore, the proposed methods can not only identify, but can also quantify the degree of blade imbalance of the wind turbine generator.

Example: Bent Blade Detection

A bent blade is a blade of a wind turbine generator that twists flapwise or edgewise from the respective normal. A bent blade may also generate an imbalance fault in the wind turbine generator. During the experiments, one blade of the wind turbine is bent edgewise at 2, 4, and 6 degrees, respectively.

In the experimental studies, an excitation appears at a fixed frequency of 1P (10 Hz) in the 1P-invariant PSD plots of the bent blade cases. The magnitude of the 1P excitation provides an effective index for detecting and quantifying the bent blade faults. Since the wind turbine is operated in the wind tunnel during the experiments and there is no wind shear or yaw error in the wind tunnel, there is no excitation at 2P frequency in the experimental results, which is another characteristic frequency of aerodynamic asymmetries.

In certain implementations, a generic computing system can be used for the operations described in association with any of the computer-implement methods, controllers, or systems described previously. The generic computing system can include a processor, a memory, a storage device, and an input/output device, for example. Each of the processor, memory, storage device, and/or input/output device can be interconnected using a system bus. The processor is capable of processing instructions for execution within the generic computing system. In one implementation, the processor is a single-threaded processor. In another implementation, the processor is a multi-threaded processor. The processor is capable of processing instructions stored in the memory or on the storage device to display graphical information for a user interface on the input/output device.

The memory stores information within the generic computing system. In one implementation, the memory is a computer-readable medium. In one implementation, the memory is a volatile memory unit. In another implementation, the memory is a non-volatile memory unit.

The storage device is capable of providing mass storage for the generic computing system. In one implementation, the storage device is a computer-readable medium. In various different implementations, the storage device may be a floppy disk device, a hard disk device, an optical disk device, or a tape device.

The input/output device provides input/output operations for the generic computing system. In one implementation, the input/output device includes a keyboard and/or pointing device. In another implementation, the input/output device includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, e.g., in a machine-readable storage device or in a propagated signal, for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; cloud-based memory devices and disks, magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks forming the Internet.

The computer system can include clients and servers. A client and server are generally remote from each other and typically interact through a network, such as the described one. The relationship of client and server arises by virtue of computer programs running on the respective computers and having a client-server relationship to each other.

A computer program (also known as a program, software, software application, script, or code) can be written in any form of programming language, including compiled or interpreted languages, or declarative or procedural languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

A number of implementations have been described. Nevertheless, it will be understood that various modifications may be made without departing from the spirit and scope of the systems, devices, methods and techniques described here. For example, various forms of the flows shown above may be used, with steps re-ordered, added, or removed. It will be appreciated that any appropriate time interval may be used to make the determinations described above, and that the determinations may be made using any appropriate number of data points within the time interval. Accordingly, other implementations are within the scope of the following claims.

What is claimed is:

1. A computer-implemented wind turbine generator fault detection method executed by at least one processor, the method comprising:
   receiving, by the at least one processor, current data from a wind turbine generator during operation, the current data being sampled at a first sampling frequency;
   determining, by the at least one processor, a frequency demodulated signal and an amplitude demodulated signal by frequency demodulating and amplitude demodulating the current data;
   resampling, by the at least one processor, the frequency demodulated signal and amplitude demodulated signal corresponding to the current data using a second, different sampling frequency in order to convert a variable 1 P frequency of the wind turbine to a constant value;
   monitoring respective frequency spectra of the resampled frequency demodulated signal and amplitude demodulated signal corresponding to the current data to identify excitations in the frequency spectra; and
   in response to identifying an excitation in the frequency spectra at a frequency that is characteristic of a wind turbine generator fault, generating and transmitting an alert that indicates that a wind turbine generator fault is detected.

2. The method of claim 1, wherein the wind turbine generator fault is a fault having one or more characteristic frequencies.

3. The method of claim 1, further comprising:
   resampling the current data, the resampling including converting the variable 1 P frequency to a constant value; and
   monitoring a frequency spectra of the resampled current data to detect a wind turbine generator fault.

4. The method of claim 1, wherein receiving the current data from the wind turbine generator during operation comprises measuring one phase of a stator or rotor current in the wind turbine generator.

5. The method of claim 1, further comprising using the frequency demodulated signal corresponding to the current data to calculate a shaft rotating frequency of the wind turbine generator.

6. The method of claim 1, further comprising using upsampling and downsampling techniques to resample the frequency demodulated signal and amplitude demodulated signal corresponding to the current data.

7. The method of claim 6 wherein the upsampling techniques comprise using a constant upsampling ratio to upsample the frequency demodulated signal and amplitude demodulated signal corresponding to the current data.

8. The method of claim 6, further comprising using a variable downsampling step size to downsample the upsampled frequency demodulated signal and amplitude demodulated signal corresponding to the current data, in which the downsampling step size is based at least in part on an estimated shaft rotating frequency of the wind turbine generator.

9. The method of claim 8, wherein the downsampling step size is selected to ensure that the second sampling frequency of the resampled signals is greater than twice the characteristic frequency of a wind turbine generator fault.

10. The method of claim 1, wherein identifying an excitation in the frequency spectra at a frequency that is characteristic of a wind turbine generator fault comprises implementing an impulse detection method to discover and isolate a fault component of the at least one identified wind turbine generator fault.

11. The method of claim 1, wherein monitoring the respective frequency spectra of the resampled frequency demodulated signal and amplitude demodulated signal comprises iteratively calculating the frequency spectra of the resampled frequency demodulated signal and amplitude demodulated signal corresponding to the current data.

12. The method of claim 1, further comprising locally normalizing the frequency spectra of the resampled frequency demodulated signal and amplitude demodulated signal corresponding to the current data.

13. The method of claim 12, further comprising using a median filter to calculate a threshold to determine the excitations in the locally normalized frequency spectra of the resampled frequency demodulated signal and amplitude demodulated signal corresponding to the current data.

14. A controller configured to detect wind turbine generator faults having a processor programmed to:
receive real-time operating current data from a wind turbine generator during operation of the wind turbine generator, the current data being sampled at a first sampling frequency;
determine a frequency demodulated signal and an amplitude demodulated signal by frequency demodulating and amplitude demodulating the current data;
estimate a shaft rotating frequency of the wind turbine generator based on the frequency demodulated signal corresponding to the current data;
resample the frequency demodulated signal and amplitude demodulated signal of the current data based on the estimated shaft rotating frequency of the wind turbine generator and using a second, different sampling frequency;
calculate respective frequency spectra of the resampled frequency demodulated signal and amplitude demodulated signal corresponding to the current data; and
extract one or more impulses in the frequency spectra to detect wind turbine generator faults in a frequency domain.

15. The controller of claim 14 wherein the processor is further programmed to select a base frequency $f_b$ to be an averaged value of the estimated shaft rotating frequency.

16. The controller of claim 14, wherein the processor is further programmed to use a moving window to locally normalize the frequency spectra of the resampled frequency demodulated signal and amplitude demodulated signal corresponding to the current data.

17. The controller of claim 14, wherein the processor is further programmed to select a threshold to determine an impulse by using a median filter.

18. The controller of claim 14 further comprising:
a current sensor configured to generate current data by measuring one or more stator currents of a permanent magnet synchronous generator and measuring one or more rotor currents of a doubly-fed induction generator;
a low-pass filter configured to receive the generated current data from the current sensor; and
an analog-to-digital converter configured to receive the filtered current data from the low-pass filter.

19. A system for monitoring current to predict wind turbine generate faults comprising:
a current sensor configured to acquire current data from an operating wind turbine generator; and
a processor connected to receive the current data from the current sensor, the processor programmed to:
receive, from the current sensor, current data from a wind turbine generator during operation of the wind turbine generator, the current data being sampled at a first sampling frequency;
determine a frequency demodulated signal and an amplitude demodulated signal by frequency demodulating and amplitude demodulating the current data;
resample the frequency demodulated signal and amplitude demodulated signal corresponding to the current data using a second, different sampling frequency in order to convert a variable 1 P frequency of the wind turbine to a constant value;
monitoring respective frequency spectra of the resampled frequency demodulated signal and amplitude demodulated signal corresponding to the current data to identify excitations in the frequency spectra; and
in response to identifying an excitation in the frequency spectra at a frequency that is characteristic of a wind turbine generator fault, generating and transmitting an alert that indicates that a wind turbine generator fault is detected.

20. The current monitoring system of claim 19, wherein the processor is further programmed to upsample the frequency demodulated signal and amplitude demodulated signal corresponding to the current data with a constant upsampling ratio.

21. The current monitoring system of claim 20, wherein the processor is further programmed to upsample using an upsampling ratio that samples at a frequency that is greater than twice the frequency of one of the variable fault characteristic frequencies.

22. The current monitoring system of claim 19, wherein the processor is further programmed to downsample the frequency demodulated signal and amplitude demodulated signal using a variable downsampling step size, the downsampling step size dependent upon a shaft rotating frequency of the wind turbine generator.

23. The current monitoring system of claim 19, wherein the processor is further programmed to detect wind turbine generator faults based on a magnitude of the one or more identified excitations at a converted constant fault characteristic frequencies in the frequency spectra of the resampled frequency demodulated signal and amplitude demodulated signal.

* * * * *